United States Patent [19]

Wei et al.

[11] Patent Number: 5,047,367
[45] Date of Patent: Sep. 10, 1991

[54] PROCESS FOR FORMATION OF A SELF ALIGNED TITANIUM NITRIDE/COBALT SILICIDE BILAYER

[75] Inventors: Chin-Shih Wei, Fremont; David B. Fraser, Danville; Venkatesan Murali, San Jose, all of Calif.

[73] Assignee: Intel Corporation, Santa Clara, Calif.

[21] Appl. No.: 535,423

[22] Filed: Jun. 8, 1990

[51] Int. Cl.⁵ .......................... H01L 21/44
[52] U.S. Cl. .................... 437/200; 437/201; 437/192; 437/178; 437/190; 148/DIG. 147
[58] Field of Search ........... 437/200, 201, 192, 189, 437/177, 178, 179, 190; 148/DIG. 147; 357/71

[56] References Cited

U.S. PATENT DOCUMENTS

| | | | |
|---|---|---|---|
| 4,206,540 | 6/1980 | Gould | 437/190 |
| 4,378,628 | 4/1983 | Levinstein et al. | 437/202 |
| 4,398,344 | 8/1983 | Gould | 437/179 |
| 4,864,378 | 9/1989 | Tsaur | 437/178 |
| 4,931,353 | 6/1990 | Tanielian | 437/200 |

FOREIGN PATENT DOCUMENTS 0298109 12/1987 Japan .................... 437/200

OTHER PUBLICATIONS

Novel Submicron MOS Devices by Self-Aligned Nitridation of Silicide; Kaneko et al.; 1985 IEEE; pp. 208-211.

Cobalt Silicide Interconnection from a Si/Uv/Lo Trilayer Structure; Lin et al.; J. Electrochem. Soc. vol. 136, No. 1; 1/89.

Primary Examiner—Brian E. Hearn
Assistant Examiner—Michael Trinh
Attorney, Agent, or Firm—Blakely, Sokoloff, Taylor & Zafman

[57] ABSTRACT

A process for the formation of a titanium nitride/cobalt silicide bilayer for use in semiconductor processing. Titanium and then cobalt are deposited on a silicon substrate by sputter deposition techniques. The substrate is then annealed. During this process the titanium first cleans the silicon surface of the substrate of any native oxide. During the anneal, the titanium diffuses upward and the cobalt diffuses downward. The cobalt forms a high quality epitaxial cobalt silicide layer on the silicon substrate. The titanium layer diffuses upward to the surface of the bilayer. The anneal is carried out in a nitrogen or ammonia ambient, so that a titaniun nitride layer is formed. The resulting structure can be used in self aligned silicide technology, as a contact fill material for contact to electrical regions of the device, and as a diffusion barrier preventing the diffusion of aluminum from a subsequently deposited aluminum layer or the diffusion of dopants from a subsequently grown doped selective silicon layer into the silicon substrate.

37 Claims, 4 Drawing Sheets

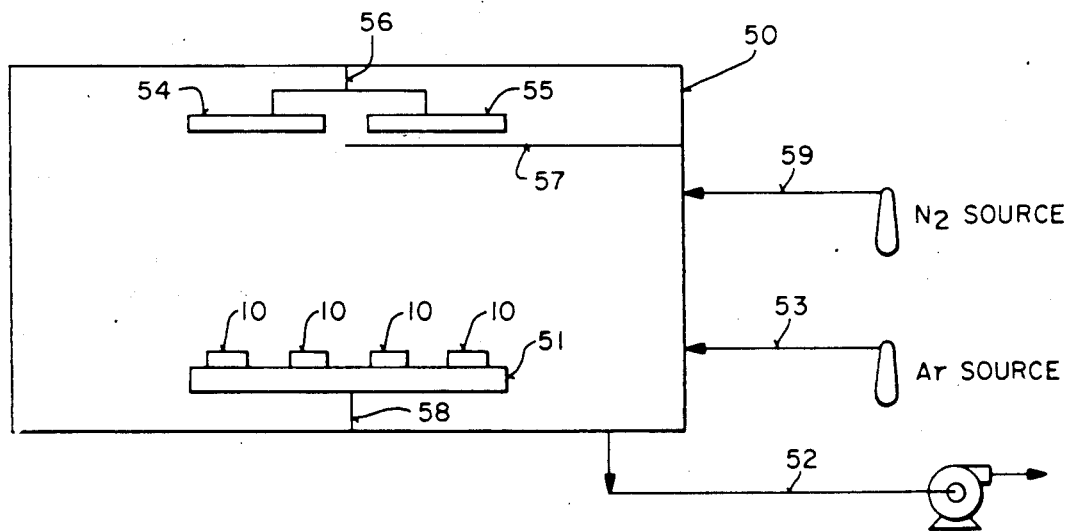
FIG_1

FIG_2
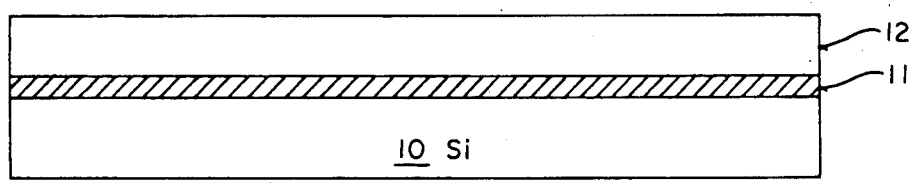
FIG_3
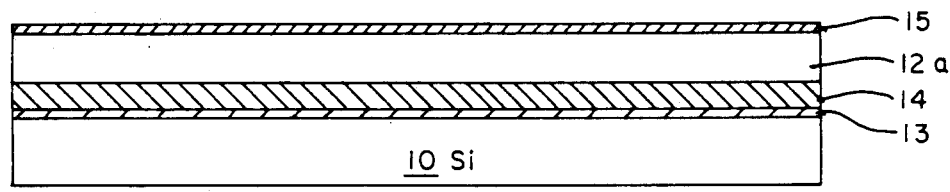
FIG_4
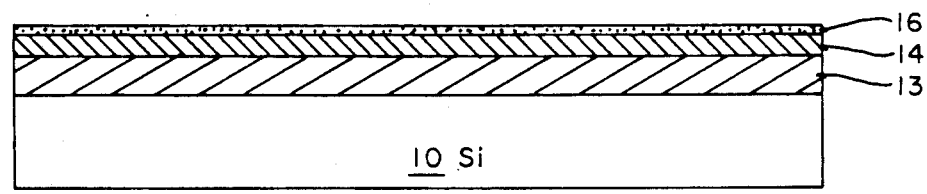
FIG_5
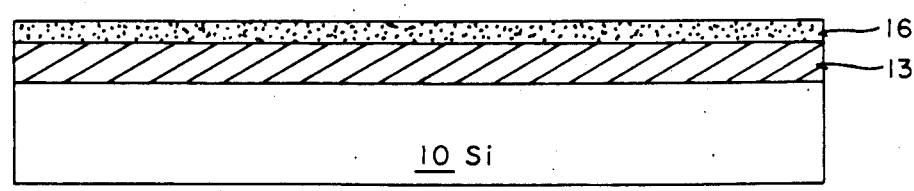

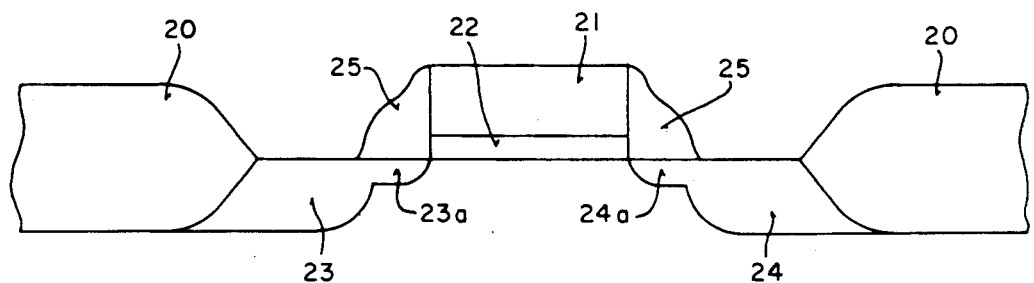
FIG_6
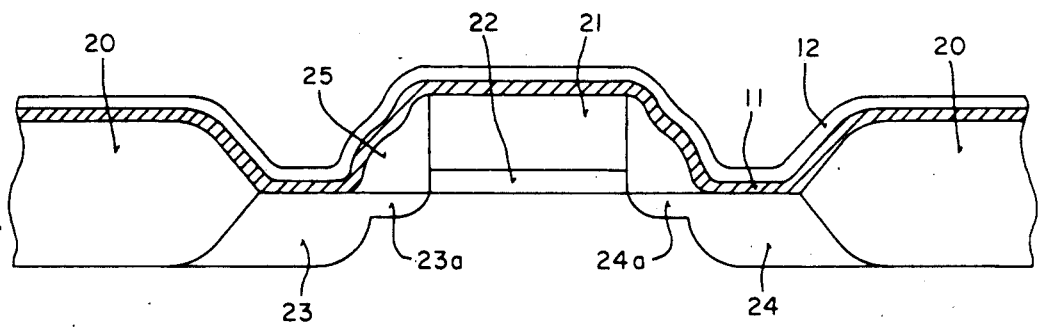
FIG_7
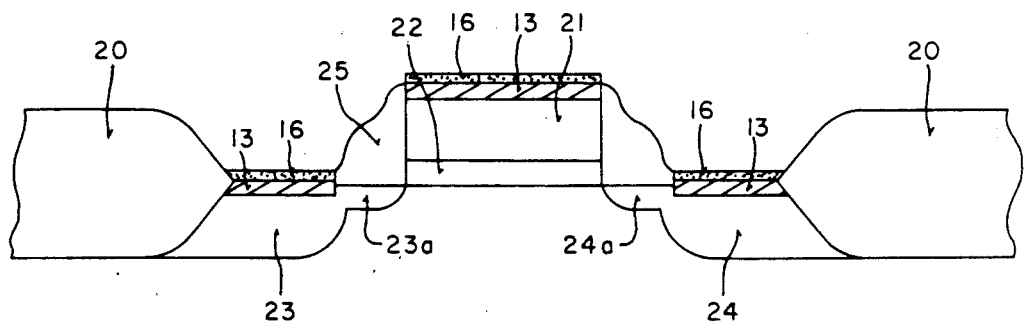
FIG_8

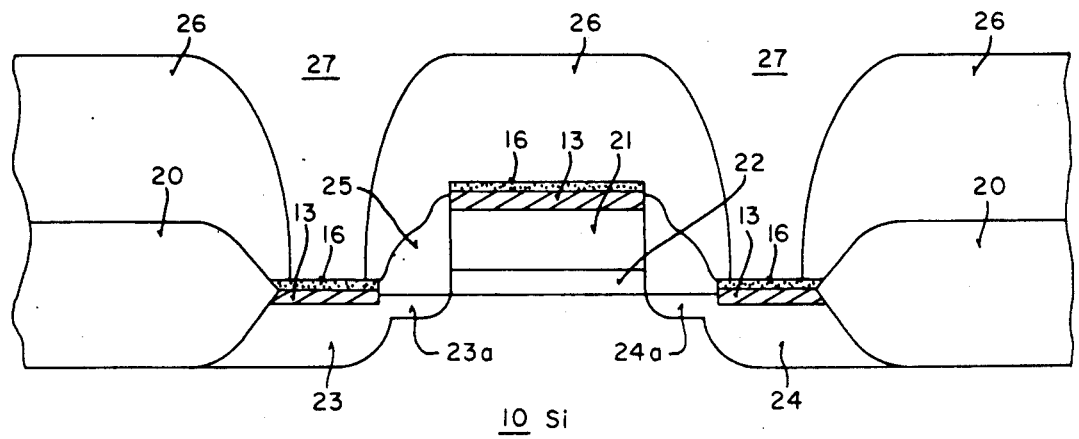
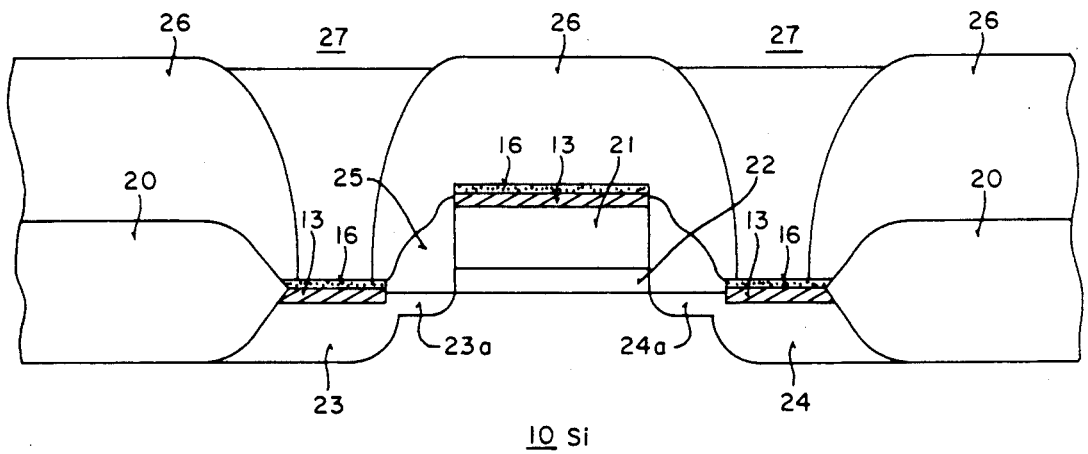
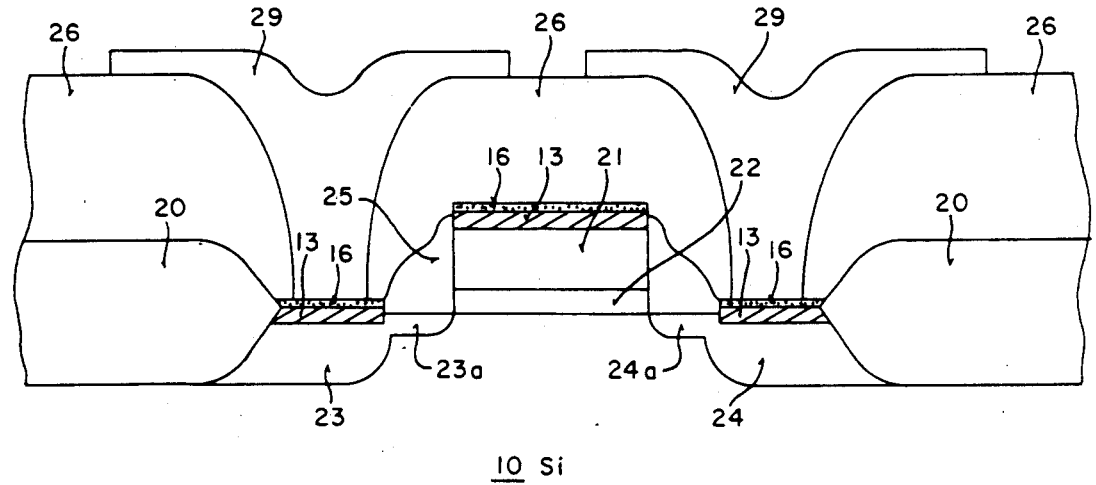

5,047,367

PROCESS FOR FORMATION OF A SELF ALIGNED TITANIUM NITRIDE/COBALT SILICIDE BILAYER

BACKGROUND OF THE PRESENT INVENTION

1. Field of the Invention

This invention relates to the field of semiconductor devices, and more specifically, to a process designed to form a titanium nitride/cobalt silicide bilayer (TiN/-CoSi$_2$) for use in self aligned silicide technology, for use as a diffusion barrier, and for use as a contact via fill.

2. Prior Art

In the manufacture of semiconductor devices, silicides, materials formed by the reaction of a refractory metal or a near-noble metal with silicon, are used in a variety of applications. For example, as a contact via fill material, or as a device structure such as a floating gate or a local interconnect.

It is normally necessary to make contact to device regions underlying a dielectric on the surface of the silicon substrate. This is accomplished by first forming an opening or via (contact via) in the dielectric over the region to be contacted, and next filling the contact via with a conductive material.

After the contact vias have been filled with a conductive material, it is then necessary to electrically connect certain device regions with others, as well as to provide for electrical connection to external leads. These requirements are met by forming a wiring layer on the surface of the substrate. The wiring layer is formed by depositing a conductive material on top of the dielectric layer. This conductive layer is in direct contact with the contact fills previously formed. The conductive layer is then masked and etched to leave continuous lines of the conductive material necessary to make the appropriate connections to the device regions of the substrate underlying the contact fill. These lines are known as interconnects.

Several conductive materials can be used as a contact via fill. In larger geometry devices, aluminum (Al) is deposited on the entire substrate, including over the vias. The areas over the vias and interconnects are then masked with photo resist and the aluminum is then etched from the remaining areas, leaving the vias filled with aluminum as well as forming interconnects on the surface of the dielectric layer.

In smaller geometry devices, those one micron or less, aluminum has proven to be inadequate as a fill due to problems such as poor step coverage and poor contact integrity. For these devices silicides of refractory or nearnoble metals, such as titanium or cobalt, are used as the initial fill material filling the lower portion of the via in contact with the substrate. The metal is first deposited followed by an anneal to form the silicide on the substrate in the regions exposed by the via. The non silicidized metal remaining on the dielectric surface is then selectively etched. Because the silicide is formed only on those regions where there is silicon exposed, that is, the active device regions, and the remaining metal can be selectively etched without a masking step, the structure formed by this process is self aligned. This process is an example of self aligned silicide technology (Salicide Technology).

After the silicide formation in the lower portion of the via is completed, it is then necessary to fill the unfilled upper portion of the via with aluminum or another conductive material and to form interconnects as described above. However, if aluminum is deposited directly on the silicide, the aluminum frequently will diffuse through the silicide into the underlying active device region of the substrate, causing device failure. This phenomenon is known as spiking. To prevent spiking it is necessary in the prior art techniques described above to form a diffusion barrier prior to aluminum deposition. This is accomplished by first depositing an additional dielectric layer. That deposition is followed by masking and etching steps to remove the dielectric from the via regions. A thin layer of titanium, titanium nitride or titanium tungsten is formed to act as a diffusion barrier. The aluminum is then deposited, masked and etched, as described above, with the barrier layer being etched from unmasked portions along with the aluminium. See for example U.S. Pat. No. 4,566,026 where a titanium tungsten nitride/titanium nitride bilayer is used a diffusion barrier against spiking.

Another alternative is to form the silicide as described above, and next grow a selective tungsten layer to fill the via. However, selective tungsten deposition generally leads to degradation of the junction integrity and unacceptably high specific contact resistivity.

Alternatively, in the prior art, after the self aligned silicide formation described above, a doped selective silicon layer is grown on top of the silicide layer to completely fill the via. Selective silicon has improved junction integrity, that is, good diode I-V characteristics such as low reverse bias leakage current and a good ideality factor. A problem with this method is that during drive-in and subsequent high temperature steps excessive dopant from the selective silicon layer may diffuse into the active device regions and change the device performance characteristics. Additionally, in CMOS devices, to prevent the formation of unintended p-n junctions it is necessary to first grow p-type selective silicon over the p-type regions keeping the n-type regions masked, and then grow n-type selective silicon over the n-type regions using an n-type dopant such as arsenic, phosphorous or antimony, keeping the p-type regions masked during this step.

In addition to via fill applications, the salicide technology described above can be used for forming other device regions. For example, the technology can be used to form a silicide on top of polysilicon to be used as a floating gate. Additionally, local interconnects can be formed using this technology after deposition, masking and etch of a polysilicon layer.

In the prior art, titanium silicide and cobalt silicide are the two most commonly used silicides for salicide technology. However, the formation of cobalt silicide is impeded by the presence of a native oxide on the substrate surface. This can be overcome by performing a high temperature heating on the substrate immediately before deposition, and then depositing the cobalt under ultra high vacuum. Such ultra high vacuum systems however are generally for use in research, but do not have the throughput capabilities needed for volume production.

Similarly, the formation of titanium silicide is impeded by the presence of oxygen in the annealing ambient. Additionally, the presence of oxygen leads to localized defects in the titanium silicide layer formed.

What is needed is a manufacturable method of forming a high quality silicide compatible with the self aligned silicide technology described above. It is also preferable that any such method include the formation of a diffusion barrier to prevent the diffusion of subsequently deposited aluminum from spiking through to the device regions, or to prevent the dopants in a subsequent selective silicon layer from diffusing into the device region.

SUMMARY OF THE INVENTION

The present invention describes a process for forming an epitaxial quality titanium nitride/cobalt silicide (TiN/CoSi$_2$) bilayer for use in self aligned silicide technology, and as a contact via fill. The titanium nitride layer formed using the present invention can be used as a barrier layer to prevent the diffusion of dopants or aluminum into the device region in the substrate.

In the present invention, a thin layer of titanium is conformally deposited on the silicon substrate using sputter deposition techniques. A conformal layer of cobalt is next deposited by sputter deposition, without removing the substrate from the system.

After deposition of the titanium and cobalt, the substrate is annealed in a nitrogen or ammonia ambient. During this anneal step, the titanium at the silicon surface reacts with the native oxide on the substrate surface, releasing the oxygen and leaving a clean silicon surface free of oxide. After removal of the native oxide, the titanium diffuses upward through the cobalt to the surface, while the cobalt diffuses downward to the silicon surface where it reacts to form cobalt silicide. Because the substrate surface has been cleaned of native oxide, the cobalt silicide formed is of high quality. In practice, low defect, epitaxial cobalt silicide films have been formed.

Meanwhile, the titanium which has moved to the upper surface of the bilayer reacts with the nitrogen or ammonia to form titanium nitride. By the end of the anneal step, the titanium and cobalt are completely segregated, with all the cobalt having formed a cobalt silicide layer in electrical contact with the device region on the substrate surface. The titanium has formed a titanium nitride layer disposed directly above and in electrical contact with the cobalt silicide layer.

The above process can be used to form self aligned silicide structures. The structures formed provide high contact stability and low contact resistance. Additionally, the process can be used as the initial step in forming a contact via fill. In vias regions the formation of the titanium nitride/cobalt silicide bilayer can be followed by the formation of a selective tungsten layer, a selective silicon layer, or an aluminum layer to complete the contact fill.

In the case of selective tungsten grown as a contact fill on the bilayer of the present invention, low specific contact resistivity has been achieved without significant degradation of the contact junction integrity.

In the case of selective silicon, the titanium nitride layer of the present invention acts as a diffusion barrier layer, preventing the diffusion of dopants implanted in the selective silicon layer into the device region. This improves the device yield, as there is no possibility that the implanted dopant will affect the quality of devices by diffusing into the active device regions and thereby change the device characteristics. Additionally when forming a contact fill on CMOS devices, where device regions of both types are present, it is not necessary to carry out two separate selective silicon growth steps as with the prior art. Because of the presence of a barrier layer in the present invention, only one selective silicon growth step is necessary, which can be either n-or p-type.

In processes where aluminum is used to complete the contact fill, the titanium nitride layer acts as a diffusion barrier to aluminum, thereby preventing the spiking of aluminum into the device region.

The presence of a titanium nitride layer on top of the cobalt silicide layer also improves the thermal stability of the cobalt silicide, reducing the tendency of cobalt silicide to form clusters (agglomeration) during subsequent high temperature processing steps.

The present invention describes a process for forming a high quality titanium nitride/cobalt silicide bilayer with high contact stability and low contact resistance. The bilayer formed by the present invention can be used in salicide technology, as a contact fill, and as a diffusion barrier. The cobalt silicide layer formed is of epitaxial quality and has high thermal stability due to the structure of the bilayer. The titanium nitride layer acts as a diffusion barrier, improving device yields and simplifying processing when aluminum is subsequently deposited or when a selective silicon layer is subsequently deposited and doped.

BRIEF DESCRIPTION OF THE DRAWINGS

FIG. 1 is a cross-sectional schematic view of a sputtering chamber where the titanium and cobalt layers of the present invention are deposited.

FIG. 2 is a cross-sectional elevation view of a silicon substrate with a titanium layer and a cobalt layer formed thereon.

FIG. 3 is a cross-sectional view of the semiconductor body of FIG. 1 after an anneal has proceeded for a short period of time.

FIG. 4 is a cross-sectional elevation view of the semiconductor body of FIG. 3 at a later time during the anneal.

FIG. 5 is a cross-sectional elevation view of the semiconductor body of FIG. 4 after completion of the anneal.

FIG. 6 is a cross-sectional elevation view of a prior art MOS device.

FIG. 7 is a cross-sectional elevation view of the semiconductor body of FIG. 6 after deposition of a titanium layer and a cobalt layer.

FIG. 8 is a cross-sectional elevation view of the semiconductor body of FIG. 7 after anneal.

FIG. 9 is a cross-sectional elevation view of the semiconductor body of FIG. 8 after deposition, masking and etch of a dielectric layer.

FIG. 10 is a cross-sectional view of the semiconductor body of FIG. 9 with a selectively grown via fill.

FIG. 11 is a cross-sectional view of the semiconductor body of FIG. 9 after deposition, masking and etch of an aluminum contact fill and wiring layer.

DETAILED DESCRIPTION OF THE PRESENT INVENTION

The present invention describes a process for forming an epitaxial quality titanium nitride/cobalt silicide (TiN/CoSi$_2$) bilayer for use in self aligned silicide technology, and as a contact via fill. The titanium nitride layer formed using the present invention can be used as a barrier layer to prevent the diffusion of dopants or aluminum into the device region in the substrate. In the following description, numerous specific details are set forth such as specific thicknesses, etc., in order to provide a thorough understanding of the present invention.

It will be obvious, however, to one skilled in the art, that the present invention may be practiced without these specific details. In other instances, well known process steps have not been described in detail in order not to unnecessarily obscure the present invention.

The present invention is practiced in the currently preferred embodiment in commercially available sputter deposition system such as those manufactured by Perkin-Elmer for batch processing, and those manufactured by Varian, Anelva, or Applied Materials Technology for single wafer processing. A cross sectional schematic view of the sputtering chamber 50 of a batch system is shown in FIG. 1. The silicon substrates 10 are placed on the pallet 51 in the chamber 50. In practice, up to 50 wafers can be processed at once in the currently preferred batch system. In a single wafer system only one silicon substrate 10 is placed on pallet 51 during the deposition. These systems are favored for their superior deposition uniformity over the wafer.

After the silicon substrates have been placed in the chamber 50, a vacuum is created in the chamber 50 by pulling a vacuum through line 52. Initially, a mechanical pump is used to reduce the pressure in the chamber to $10^{-3}$–$10^{-4}$ Torr. A cryogenic or turbo pump then reduces the pressure to $10^{-6}$–$10^{-8}$ Torr. After the pressure has been reduced to $10^{-6}$–$10^{-8}$ Torr, argon is introduced into the chamber through line 53. The argon pressure is then maintained at approximately 1–50 m Torr during the deposition process. The argon is then ignited to form a plasma of $Ar^+$ ions. The targets 54 and 55 are made of the metals to be deposited and can be either a sputtering gun or a planar magnetron target. In the currently preferred sputtering systems up to 3 targets can be placed in the system so that 3 different materials can be sputter deposited without removing the substrates 10 from the chamber 50. Alternatively, the sequential deposition of metals can be performed in separate chambers, removing the silicon substrates 10 from chamber 50 after each deposition. In the currently preferred embodiment target 54 is made of titanium. Alternatively, other refractory metals such as zirconium (Zr), hafnium (Hf), or vanadium (V) could be used. Also in the currently preferred embodiment target 55 is made of cobalt. Alternatively, other near-noble metals such as nickle (Ni), palladium (Pd), or platinum (Pt) could be used.

To deposit a material, a target is rotated about axle 56 to the position occupied by target 54, which is directly above an opening in shield 57, as shown in FIG. 1. The target 54 is then biased negatively, causing the positively charged $Ar^+$ ions to bombard the target. This knocks off atoms of the target which then are propelled toward the substrates 10 on pallet 51. To ensure coating of all wafers, pallet 51 rotates about axle 58 during the deposition. To deposit another metal after the first deposition is complete, target 55 is rotated into the position shown occupied by target 54 in FIG. 1, and the above process is repeated. The above described sputter deposition is carried out using well known prior art sputter deposition systems and techniques.

FIG. 2 shows the surface of a silicon substrate 10 after deposition of a refractory metal layer 11 and a near-noble metal layer 12. In the currently preferred embodiment, refractory metal layer 11 is made of titanium and near-noble metal layer 12 is made of cobalt. Although the precise thicknesses are not critical, the titanium layer 11 has a thickness in the range of 50–300 angstroms in the currently preferred embodiment, and the cobalt layer 12 has a thickness in the range of 100–500 angstroms in the currently preferred embodiment. The substrates 10 are next processed through an anneal step. The anneal will take place in a commercially available rapid thermal processing system (RTP) such as those manufactured by AG Associates or Peak Systems, or a conventional furnace with precise oxygen ambient control. Alternatively, the anneal can take place in two steps, with an etch step included between the two anneals to remove unreacted metals, as described below in connection with the use of the present invention in the formation of a via fill on an MOS device. The parameters of the anneal such as the temperature and time are designed to ensure that the formation of titanium nitride and cobalt silicide, as described below in reference to FIGS. 2–5, are complete. In the currently preferred embodiment, the substrates are annealed in the RTP system for 15–30 seconds at 600–750 degrees C. for the first anneal and for 15–30 seconds at 850–950 degrees C. for the second anneal. Alternatively, when using a conventional furnace, the substrates are annealed for 20–40 minutes at 600–750 degrees C. for the first anneal and for 20–40 minutes at 850–950 degrees C. for the second anneal.

As can be seen from FIG. 2, titanium layer 11 is in direct contact with the silicon substrate 10 after the deposition. During the initial stages of the anneal, the titanium layer 11 is responsible for removing any native oxide ($SiO_2$) on the surface of silicon substrate 10. It is believed that this occurs as a result of the reaction of titanium and silicon dioxide ($SiO_2$) to form a titanium oxide ($TiO_x$) and titanium silicide ($Ti_5Si_3$ and $TiSi_2$). The titanium oxide then travels to the surface along with the unreacted titanium, as will be described below in reference to FIGS. 3–5, where the oxygen is released to the ambient. The titanium silicide is eventually completely silicidized to $TiSi_2$ and remains at the surface of silicon substrate 10. Generally, only a minor amount of titanium silicide is formed since the native oxide layer with which the titanium reacts is only in the range of 10–50 Angstroms.

The intermediate steps in the formation of the titanium nitride/cobalt silicide bilayer are discussed below with reference to FIGS. 3–5. The intermediate structures described have been determined by analyzing the film on silicon substrate 10 at various times during the annealing by well known prior art techniques such as Auger analysis, X-ray diffraction and transmission electron microscopy (TEM).

FIG. 3 shows the structure of the deposited layers after the anneal has proceeded for a short period of time. Some titanium from titanium layer 11 of FIG. 2 has diffused up through the cobalt layer 12 to form titanium layer 15 at the upper surface of the structure, disposed on the cobalt layer 12a, which is now slightly thinner than cobalt layer 12 of FIG. 2, due to downward diffusion of cobalt. Beneath layer 12a is layer 14, which is a mixture of titanium and cobalt. Disposed beneath layer 14 is layer 13, which is the initial cobalt silicide layer formed from the reaction of the cobalt, which has diffused downward, and the silicon on the surface of silicon substrate 10. Initially, layer 13 is not completely silicidized and is comprised of CoSi and $CoSi_2$.

Referring to FIG. 4, the titanium layer 15 from FIG. 3 has formed titanium nitride layer 16 by reacting with the nitrogen ($N_2$) or ammonia ($NH_3$) in the ambient. The remaining cobalt from cobalt layer 12a of FIG. 2 has now completely diffused downward into titanium cobalt layer 14 and cobalt silicide layer 13.

FIG. 5 shows the bilayer after the anneal step is completed. Cobalt silicide layer 13 ($CoSi_2$) is disposed on the surface of silicon substrate 10. Although the precise thickness is not critical, in the currently preferred embodiment, the thickness of cobalt silicide layer 13 is in the range of 300-2000 angstroms. Titanium nitride layer 16 is disposed on top of cobalt silicide layer 13. Although the precise thickness is not critical, in the currently preferred embodiment the thickness of titanium nitride layer 16 is in the range of 50-500 angstroms. The titanium nitride/cobalt silicide bilayer (layers 16 and 13) shown in FIG. 5 has several advantageous applications in the production of silicon based devices.

Because the titanium layer 11 of FIG. 2 has cleaned the surface of silicon substrate 10 of all native oxide, the resulting cobalt silicide layer 13 of FIG. 5 is low defect and of epitaxial quality. It is anticipated that the silicide layer 13 formed by the present invention will be useful in the formation of three dimensional or vertical devices, as a selective epitaxial silicon layer can be grown on top of the silicide layer 13 of the present invention. To grow epitaxial selective silicon, is it necessary to first etch the TiN layer.

Additionally, the titanium nitride/cobalt silicide bilayer of the present invention can be used in salicide technology, as described below in conjunction with FIGS. 6-11.

FIG. 6 shows a typical prior art MOS floating gate transistor on silicon substrate 10. The region labeled 20 is the field oxide made of silicon dioxide ($SiO_2$). Region 21 is made of polysilicon. The process of the present invention will form a floating gate from the polysilicon of region 21. Region 22 is the gate oxide, also made of $SiO_2$. Regions 23 and 24 are the source and drain regions, respectively, and are formed by doping the silicon substrate 10 in the regions indicated. If silicon substrate is a p-type substrate, regions 23 and 24 will be doped n-type; conversely if silicon substrate 10 is an n-type substrate, regions 23 and 24 will be doped p-type. Most of regions 23 and 24 will be heavily doped, with the exceptions of regions 23a and 24a, which are lightly doped. Region 25 is a spacer. The spacer 25 can be made of $SiO_2$ or silicon nitride ($Si_3N_4$). The structure of FIG. 6 is made by well known prior art techniques.

FIG. 7 shows the structure of FIG. 6 after the deposition of titanium layer 11 and cobalt layer 12, as described above. The structure of FIG. 7 will then be processed through a first anneal step in a nitrogen or ammonia ambient using the operating parameters stated above.

After the first anneal, layers 11 and 12 will have formed an intermediate structure such as that shown in FIG. 4 in those regions where layers 11 and 12 overlie silicon, that is, over regions 23, 24 and 21 of FIG. 7. After the first anneal, the structure of FIG. 7 will then undergo a cobalt etch and titanium etch. The cobalt etch can be performed, for example, in a mixture of nitric acid ($HNO_3$) and water ($H_2O$). The volume ratio of $HNO_3:H_2O$ is approximately 1:1. The etch is carried out at room temperature for a time in the range of 5-20 minutes. The titanium etch can be performed, for example, in a mixture of hydrogen peroxide ($H_2O_2$), ammonium hydroxide ($NH_4OH$) and water ($H_2O$). The volume ratio of $H_2O_2:NH_4OH:H_2O$ is approximately 2:1:1. The etch is carried out at room temperature for a time in the range of 5-20 minutes. These etches are selective, that is, they will remove all unreacted metal over the $SiO_2$ field oxide and the $SiO_2$ or $Si_3N_4$ spacers, but will not etch the intermediate silicide/nitride structure overlying the exposed silicon regions. These etches normally must be carried out before the complete formation of the titanium nitride/cobalt silicide bilayer of the present invention because if the anneal is carried to completion before etch, silicon from regions 21, 23 and 24 of FIG. 7 will diffuse both upwards and sideways from these regions into layers 11 and 12, leading to silicide formation both above the regions 21, 23, 24 where it is desired as well as above field oxide layer 20 and spacer 25 where it is not desired. Therefore, the parameters of the first anneal have been to designed to form a protective nitride layer overlying exposed silicon regions 21, 23 and 24, without causing sideways diffusion and silicidization of layers 11 and 12 in other regions.

The structure of FIG. 7, after first anneal and metal etches, will then undergo a second anneal in a nitrogen or ammonia ambient using the operating parameters stated above to form the titanium nitride/cobalt silicide bilayer of the present invention. The resulting structure is shown in FIG. 8. The titanium nitride layer 16 and cobalt silicide layer 13 over regions 23 and 24 will be used as the initial fill for the contact fill. The titanium nitride layer 16 and cobalt silicide layer 13 over polysilicon region 21 forms the floating gate. Both of these structures are self aligned.

It will be appreciated that the present invention is completely compatible with salicide technology and can be practiced on numerous devices, such as MOS transistors and CMOS transistors, as well as on numerous device regions, such as contact fill, floating gate, double poly stack floating gate, and local interconnects.

The use of the present invention for contact fill is discussed below, with reference to FIGS. 9-12. Referring to FIG. 9, the structure of FIG. 8 is shown with passivation layer 26. Passivation layer 26 can be made of, for example, boropolysilicate glass (BPSG), or other prior art dielectrics. FIG. 9 shows the structure after deposition of BPSG, masking and etch. The BPSG has been uniformly deposited over the surface, masked to expose those regions where contact is to be made, and then etched from the exposed regions. The result is to form vias 27 in the passivation layer 26, exposing the titanium nitride/cobalt silicide bilayer (layers 16 and 13) overlying the device regions 23 and 24.

In prior art processing, several materials have been used to fill vias 27 in order to make electrical contact to device regions 23 and 24. In general, the material used to fill via 27 must provide a specific contact resistivity below $1 \times 10^{-6}$ ohm-cm$^2$. The materials used have included, for example, selectively grown silicon, selectively grown tungsten, and aluminum.

Selective silicon has proven to be effective for MOS devices, having a satisfactory specific contact resistivity. The polysilicon used is doped in-situ. That is, either an n-type or p-type selective silicon is grown to fill vias 27 to form the via fill 28. In the case of CMOS devices, where contact regions of both polarity are present, the use of in-situ doped polysilicon contact plugs requires additional masking steps in prior art via fill processes. A selective p-type silicon is grown over p-type device regions while the n-type regions are masked, and a selective n-type silicon is grown over n-type regions while the p-type regions are masked. This increases process steps and thereby increases costs and decreases yields. Polysilicon can also be doped by ion implantation. However, the dosage and energy requirements to dope the polysilicon of a thickness normally used for via fill is not compatible with other requirements, such as the integrity of the thick dielectric film. Additionally, even in devices such as N-channel MOS and P-channel MOS where contact regions of only one polarity are present and polysilicon doped in-situ the same polarity as the underlying device region is used for the via fill, there is still the possibility of device degradation from the diffusion of excess dopant into the device region during the high temperature drive-in steps or during subsequent high temperature processing.

In the present invention, the titanium nitride layer 16 overlying device regions 23 and 24 acts as a diffusion barrier. That is, it prevents the diffusion of any dopant from the via fill 28 into regions 23 and 24. Therefore, the selectively grown silicon used to form the via fill 28 can be doped either n-type or p-type without regard to the polarity of the underlying device region, as the titanium nitride layer eliminates any possibility that there will be diffusion into device regions 23 and 24. The present invention, therefore, has the advantage that in-situ doped polysilicon, with its advantageous specific contact resistivity and superior junction integrity, can be used as the via fill 28 in CMOS as well as other MOS devices without the need for additional masking steps and process complexity or the need for an ion implantation.

Another contact fill material, selectively grown tungsten, is also used as a via fill in the prior art. However, the use of a selective tungsten plug has led to degradation of the junction integrity as well as specific contact resistivity above $1 \times 10^{-6}$ ohm-cm$^2$. In the present invention a selective tungsten layer has been grown on titanium nitride layer 16 in the via fill areas 27 to form the via fill 28 of FIG. 10. In practice, the selective tungsten grown on this layer has had a specific contact resistivity below $1 \times 10^{-6}$ ohm-cm$^2$, and has not shown significant degradation of the contact integrity.

Aluminum is also used as a via fill in the prior art in devices where the geometries allow, generally those with a width and depth greater than 1 micron. In prior art devices, a problem encountered when using aluminum as a via fill is that it diffuses into the device regions 23 and 24, resulting in device failure. This phenomena is known as spiking. In the present invention the titanium nitride layer 16 acts as a diffusion barrier to aluminum. Therefore, aluminum can be used to fill via 27 of FIG. 9 without the occurrence of spiking. The resulting structure with aluminum as a via fill 29 is shown in FIG. 11. To form the structure of FIG. 11 a blanket layer of aluminum is deposited. The substrate is then masked, covering the via regions 27, as well as forming lines to be used as interconnects. The aluminum is then etched from the remaining areas, leaving the vias filled with aluminum via fill 29 making electrical contact to titanium nitride layer 16 and cobalt silicide layer 13, which is in electrical contact with device regions 23 and 24, and forming interconnects on the surface of the BPSG layer 26.

An additional advantage of the present invention is that titanium nitride layer 16 is known as a hard coating. Without such a coating, the cobalt silicide in the source, drain and gate areas, that is, above regions 23, 24 and 21, would have poor high temperature stability. That is, the cobalt silicide would have a tendency to cluster or agglomerate. Agglomeration results in a discontinuous cobalt silicide layer 13. This can lead to an increased sheet resistance of the layer 13 and therefore higher contact and S/D spreading resistance. Additionally, the clusters formed can pierce through device regions 23 and 24 to the silicon substrate 10 and short out the junction. The presence of the titanium nitride layer 16 above the cobalt silicide layer 13 prevents this agglomeration from occurring. It is believed that the titanium nitride layer prevents this agglomeration by maintaining a high pressure in the cobalt silicide layer and allowing no room for movement or alteration of the layer.

Thus, a process for forming a high quality titanium nitride/cobalt silicide bilayer with high contact stability and low contact resistance for use in salicide technology, as a contact fill and as a diffusion barrier is described.

We claim:

1. A process for forming a bilayer on a silicon substrate comprising the steps of:
conformally depositing on said silicon substrate a first layer comprising a refractory metal;
conformally depositing on said first layer a second layer comprising a near-noble metal;
performing an anneal on said silicon substrate in a nitrogen containing gas selected from the group consisting of nitrogen and ammonia to form a near-noble metal silicide layer disposed above said silicon substrate and a refractory metal nitride layer disposed above said near-noble metal silicide layer.

2. The process as described in claim 1 wherein said near-noble metal silicide layer has a thickness in the range of 300-2000 Angstroms and said refractory metal nitride layer has a thickness in the range of 50-500 Angstroms.

3. The process as described in claim 1 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said second anneal is performed at a temperature in the range of 850-950 degrees Celsius, and said second anneal is performed for a length of time in the range of 15-30 seconds for rapid thermal anneal and 20-40 minutes for furnace anneal.

4. The process as described in claim 2 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said second anneal is performed at a temperature in the range of 850-950 degrees Celsius, and said second anneal is performed for a length of time in the range of 15-30 seconds for rapid thermal anneal and 20-40 minutes for furnace anneal.

5. The process as described in claim 1 wherein said near-noble metal silicide is of epitaxial quality.

6. The process as described in claim 2 wherein said near-noble metal silicide is of epitaxial quality.

7. The process as described in claim 3 wherein said near-noble metal silicide is of epitaxial quality.

8. The process as described in claim 4 wherein said near-noble metal silicide is of epitaxial quality.

9. The process as described in any one of claims 1-8 wherein said refractory metal is titanium, said refractory metal nitride is titanium nitride, said near-noble metal is cobalt and said near-noble metal silicide is cobalt silicide.

10. A process for forming a bilayer on exposed silicon regions on a silicon substrate comprising the steps of:
conformally depositing on said silicon substrate a first layer comprising a refractory metal;
conformally depositing on said first layer a second layer comprising a near-noble metal;
performing an anneal on said silicon substrate in a nitrogen containing gas selected from the group consisting of nitrogen and ammonia to form a near-noble metal silicide layer disposed above said silicon substrate and a refractory metal nitride layer disposed above said near-noble metal silicide layer;
performing a first etch to remove said near-noble metal layer from all regions except said exposed silicon regions;
performing a second etch to remove said refractory metal layer from all regions except said exposed silicon regions;
performing a third etch to remove said refractory metal nitride layer;
selectively depositing a silicon layer on said near-noble metal silicide layer to form said bilayer comprising a near-noble metal silicide layer and a selective silicon layer.

11. The process as described in claim 10 wherein said near-noble metal silicide layer has a thickness in the range of 300-2000 Angstroms.

12. The process as described in claim 10 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

13. The process as described in claim 11 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

14. The process as described in claim 10 wherein said near-noble metal silicide and said selective silicon are of epitaxial quality.

15. The process as described in claim 11 wherein said near-noble metal silicide and said selective silicon are of epitaxial quality.

16. The process as described in claim 12 wherein said near-noble metal silicide and said selective silicon are of epitaxial quality.

17. The process as described in claim 13 wherein said near-noble metal silicide and said selective silicon are of epitaxial quality.

18. The process as described in any one of claims 10-17 wherein said refractory metal is titanium, said refractory metal nitride is titanium nitride, said near-noble metal is cobalt and said near-noble metal silicide is cobalt silicide.

19. A process for forming a fill for contact areas on a silicon substrate comprising the steps of:
conformally depositing on said silicon substrate a first layer comprising a refractory metal;
conformally depositing on said first layer a second layer comprising a near-noble metal;
performing an anneal on said silicon substrate in a nitrogen containing gas selected from the group consisting of nitrogen and ammonia to form a near-noble metal silicide layer disposed above said contact areas on said silicon substrate and a refractory metal nitride layer disposed above said near-noble metal silicide layer;
performing a first etch of said near-noble metal layer from all regions except said contact areas;
performing a second etch of said refractory metal layer from all regions except said contact areas;
conformally depositing a third layer consisting essentially of aluminum;
removing said aluminum from all regions except said contact areas to form said fill comprising a self aligned silicide layer, a self aligned refractory metal nitride layer and an aluminum layer.

20. The process as described in claim 19 wherein said near-noble metal silicide layer has a thickness in the range of 300-2000 Angstroms, said refractory metal nitride layer has a thickness in the range of 50-500 Angstroms and said aluminum layer has a thickness in the range of 1000-20,000 Angstroms.

21. The process as described in claim 19 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

22. The process as described in claim 20 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

23. The process as described in any one of claims 19-22 wherein said refractory metal is titanium, said refractory metal nitride is titanium nitride, said nearnoble metal is cobalt and said near-noble metal silicide is cobalt silicide.

24. A process for forming a fill for contact areas on a silicon substrate comprising the steps of:
conformally depositing on said silicon substrate a first layer comprising a refractory metal;
conformally depositing on said first layer a second layer comprising a near-noble metal;
performing an anneal on said silicon substrate in a nitrogen containing gas selected from the group consisting of nitrogen and ammonia to form a near-noble metal silicide layer disposed above said contact areas on said silicon substrate and a refractory metal nitride layer disposed above said near-noble metal silicide layer;
performing a first etch of said near-noble metal layer from all regions except said contact areas;
etching said refractory metal layer from all regions except said contact areas;
selectively depositing a third layer comprising silicon in said contact areas to form said fill comprising a self aligned silicide layer, a self aligned refractory metal nitride layer and a selective silicon layer.

25. The process as described in claim 24 wherein said near-noble metal silicide layer has a thickness in the range of 300-2000 Angstroms, said refractory metal nitride layer has a thickness in the range of 50-500 Angstroms and said selective silicon layer has a thickness in the range of 1000-20,000 Angstroms.

26. The process as described in claim 24 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

27. The process as described in claim 25 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

28. The process as described in claim 24 wherein said near-noble metal silicide is of epitaxial quality.

29. The process as described in claim 25 wherein said near-noble metal silicide is of epitaxial quality.

30. The process as described in claim 26 wherein said near-noble metal silicide is of epitaxial quality.

31. The process as described in claim 27 wherein said near-noble metal silicide is of epitaxial quality.

32. The process as described in any one of claims 24-31 wherein said refractory metal is titanium, said refractory metal nitride is titanium nitride, said near-noble metal is cobalt and said near-noble metal silicide is cobalt silicide.

33. A process for forming a fill for contact areas on a silicon substrate comprising the steps of:
conformally depositing on said silicon substrate a first layer comprising a refractory metal;
conformally depositing on said first layer a second layer comprising a near-noble metal;
performing an anneal on said silicon substrate in a nitrogen containing gas selected from the group consisting of nitrogen and ammonia to form a near-noble metal silicide layer disposed above said contact areas on said silicon substrate and a refractory metal nitride layer disposed above said near-noble metal silicide layer;
performing an etch of said near-noble metal layer from all regions except said contact areas;
performing an etch of said refractory metal layer from all regions except said contact areas;
selectively depositing a third layer comprising tungsten in said contact areas to form said fill comprising a self aligned near-noble metal silicide layer, a self aligned refractory metal nitride layer, and selective tungsten layer.

34. The process as described in claim 33 wherein said near-noble metal silicide layer has a thickness in the range of 300-2000 Angstroms, said refractory metal nitride layer has a thickness in the range of 50-500 Angstroms and said selective tungsten layer has a thickness in the range of 1000-20,000 Angstroms.

35. The process as described in claim 33 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

36. The process as described in claim 34 wherein said anneal comprises a first and a second anneal, said first anneal is performed at a temperature in the range of 600-750 degrees Celsius, said first anneal is performed for a length of time in the range of 15-30 seconds for rapid thermal anneal and 20-40 minutes for furnace anneal, said first anneal is performed before said first etch and said second etch, said second anneal is performed at a temperature in the range of 850-950 degrees Celsius, said second anneal is performed for a length of time in the range of 15-30 seconds for rapid thermal anneal and 20-40 minutes for furnace anneal, and said second anneal is performed after said first etch and said second etch.

37. The process as described in any one of claims 33-36 wherein said refractory metal is titanium, said refractory metal nitride is titanium nitride, said near-noble metal is cobalt and said near-noble metal silicide is cobalt silicide.

* * * * *